United States Patent
Väisänen

(10) Patent No.: US 7,330,070 B2
(45) Date of Patent: Feb. 12, 2008

(54) METHOD AND ARRANGEMENT FOR OPTIMIZING EFFICIENCY OF A POWER AMPLIFIER

(75) Inventor: Risto Väisänen, Salo (FI)

(73) Assignee: Nokia Corporation, Espoo (FI)

( * ) Notice: Subject to any disclaimer, the term of this patent is extended or adjusted under 35 U.S.C. 154(b) by 130 days.

(21) Appl. No.: 11/272,431

(22) Filed: Nov. 10, 2005

(65) Prior Publication Data

US 2007/0115053 A1    May 24, 2007

(51) Int. Cl.
*H03F 3/68* (2006.01)
(52) U.S. Cl. .................... 330/124 R; 330/51
(58) Field of Classification Search ............ 330/124 R, 330/53, 127, 51
See application file for complete search history.

(56) References Cited

U.S. PATENT DOCUMENTS

| | | | |
|---|---|---|---|
| 3,711,782 A | 1/1973 | Perrero et al. | |
| 4,053,848 A | 10/1977 | Kleische | |
| 6,166,598 A | 12/2000 | Schlueter | |
| 6,639,471 B2 | 10/2003 | Matsuura et al. | |
| 7,138,861 B2 * | 11/2006 | Sundstrom et al. | 330/124 R |
| 2005/0079835 A1 | 4/2005 | Takabayashi et al. | |
| 2005/0285682 A1 | 12/2005 | Lee et al. | |
| 2006/0139092 A1 | 6/2006 | Sundstrom et al. | |
| 2007/0184791 A1 * | 8/2007 | Vinayak et al. | 455/127.1 |

FOREIGN PATENT DOCUMENTS

| | | |
|---|---|---|
| EP | 1530303 | 5/2005 |
| WO | WO 2006/095051 | 9/2006 |

* cited by examiner

*Primary Examiner*—Robert Pascal
*Assistant Examiner*—Hieu Nguyen
(74) *Attorney, Agent, or Firm*—Alfred A. Fressola; Ware, Fressola, Van Der Sluys & Adolphson LLP

(57) ABSTRACT

The invention relates to optimizing the efficiency of a power amplifier of a transmitter. The objectives of the invention are achieved with a solution in which a voltage level of an output signal of an amplifier stage (301, 302) is detected (305, 306) at a signal output of each amplifier stage and the detected information is used for controlling a supply voltage of each amplifier stage in a way so that the unnecessarily high levels of the supply voltages can be avoided thus improving efficiency of the power amplifier.

33 Claims, 10 Drawing Sheets

METHOD AND ARRANGEMENT FOR OPTIMIZING EFFICIENCY OF A POWER AMPLIFIER

FIELD OF THE INVENTION

The invention relates to a transmitter for communicating devices. The invention especially relates to optimizing efficiency of a power amplifier of a transmitter.

BACKGROUND OF THE INVENTION

In order to optimize efficiency of a power amplifier one needs to keep a supply voltage of the power amplifier as low as possible; in this document the efficiency means 1—power losses/output power. On the other hand the supply voltage has to be high enough that no clipping occurs in an output signal of the power amplifier. Keeping the supply voltage at an optimal value is a challenging task especially when an impedance of a circuitry loading the power amplifier varies. For example, in a mobile communication device an impedance of an antenna loading a power amplifier varies considerably with frequency and with external circumstances. An example of external circumstances that has an effect on the impedance of the antenna is the position of user's fingers in the vicinity of the antenna, i.e. a 'finger effect'. In a mobile communication device the impedance of an antenna can vary over a wide range, characterized by a voltage standing wave ratio (VSWR) reaching up to 10:1. Variations in the impedance can be taken into account by keeping a value of the supply voltage so high that there is a sufficient safety margin in different situations. This kind of approach leads, however, to a situation in which the supply voltage is unnecessarily high over a significant portion of time. Too high a supply voltage means unnecessary power losses especially in output stage transistors of a power amplifier.

DESCRIPTION OF THE PRIOR ART

In many cases a power amplifier of a transmitter of a communication device is a balanced power amplifier. An advantage of a balanced power amplifier is the fact that it not so sensitive to an impedance mismatch on a signal path from an output stage of a power amplifier to a load than e.g. an ordinary single ended amplifier. FIG. 1 shows a balanced power amplifier according to prior art. The term "balanced amplifier" may cause confusion with a differential amplifier, where a phase difference between input signals of different amplifier stages is 180 degrees. In this document a two-sided amplifier with a 180 degrees phase difference is called a differential amplifier and a two-sided amplifier with a 90 degrees phase difference is called a balanced amplifier. An input signal S_in of the amplifier is conducted to a phasing part 101 that produces two versions of the input signal: a direct phase signal and another having a 90 degrees phase lag. These signal versions are separately coupled to inputs of two parallel amplifier stages 102 and 103. Output signals of the amplifier stages 102 and 103 are coupled to a so-called 3 dB hybrid 104, one output of which is terminated with a terminating impedance 105 while the other output is coupled to a load 106 via a low-pass filter 107. A signal S_out represents an output signal of the balanced power amplifier. Using two parallel amplifier stages having the 90 degrees phase difference in their inputs signals helps to cope with an unpredictably changing impedance of the load 106. In this document the amplifier stage 102 is called an in-phase amplifier stage and the amplifier stage 103 having a 90 degree phase lagging input signal is called a quadrature amplifier stage.

A supply voltage Vs is delivered to the amplifier stages 102 and 103 with a controllable voltage source 108 that is a switched mode power source (SMPS) powered with a dc-voltage Vbatt and controlled with a control voltage Vc. In order to optimize efficiency of the amplifier i.e. to avoid unnecessary power dissipation in the amplifier stages 102 and 103 the control voltage Vs should be as low as possible but, on the other hand, an output signal of either of the amplifier stages 102 and 103 must not be clipped.

U.S. Pat. No. 3,711,782 discloses an arrangement in which an output power of a balanced amplifier is measured with a directional switch and a supply voltage common to both amplifier stages is controlled according to the output power. FIG. 2 shows a solution based on this principle. An output signal of the low-pass filter 207 is conducted via a directional switch 208 that is coupled to a detector that gives a voltage Vdet that is an indicator of an output power delivered to a load 206. The voltage Vdet is conducted to a control element 210, which in turn produces a control voltage Vc. The control voltage Vc controls a controllable voltage source 211 that produces a supply voltage Vc for the amplifier stages 202 and 203. In this example the controllable voltage source 211 is a switched mode power source (SMPS) powered by a dc-voltage Vbatt. The control element 210 is a proportional controller (P-controller) that increases or decreases the supply voltage Vs when the power delivered to the load increases or decreases. When the output power is at its maximum value the supply voltage Vs is also at its maximum value and when the output power decreases also the supply Vs decreases.

The above-described principle is suitable for optimizing the efficiency of the balanced amplifier shown in FIG. 2 when an input impedance ZL of the load 206 is constant. When the input impedance ZL of the load 206 varies peak voltages of signals S1 and S2 at signal outputs of the amplifier stages 202 and 203 vary even if output power remains constant. Furthermore, in a balanced amplifier an impedance mismatch between an output impedance Zout of the amplifier and the input impedance ZL of the load 206 causes that the peak voltages of the signals S1 and S2 are not equal. For example, in an impedance matched situation the peak voltages can be 2 V for both of the signals S1 and S2 but in an impedance mismatch situation the corresponding peak voltages can be 1 V and 3 V. Due to the fact that the supply voltage Vs needs to be so high that the signal with the 3 V peak voltage is not clipped, the efficiency of the amplifier stage having the 1 V peak voltage is poor. A straightforward solution for the problem of different peak voltages is to energize the amplifier stages with separate supply voltages that can be controlled independently of each other. U.S. Pat. No. 4,053,848 presents an arrangement having separate supply voltages for different amplifier stages of a balanced amplifier, wherein each amplifier stage comprises a directional switch disposed to measure an output power of the amplifier stage. The supply voltages are controlled in a way that the output powers of the amplifier stages remain substantially constant even when there is an impedance mismatch situation. This principle is, however, not suitable for optimizing efficiencies of the amplifier stages due to the fact that the peak voltages vary with varying load impedance even if output power of the amplifier remains constant.

Solutions according to prior art also comprise methods that are based on measuring a power delivered from an amplifier to a load and a power reflected back to the amplifier from a signal input terminal of the load. The measured output and reflected power values are inputs of an arithmetic unit that controls a supply voltage so that changes in a peak-to-peak voltage range at an output stage of the amplifier can be taken into account. This kind of approach is presented in U.S. Pat. No. 6,639,471 that presents an approach based on calculating an antenna impedance. The above-referred methods require, however, significant computation capacity and practical realizations are complex. Furthermore, these methods are not suitable for a balanced amplifier of the kind described above. For example, a fact that there may be different peak voltages at signal outputs of different amplifier stages is not taken into account.

BRIEF DESCRIPTION OF THE INVENTION

It is an objective of the present invention to provide a balanced power amplifier the efficiency of which can be optimized so that the limitations and drawbacks associated with prior art are eliminated or reduced. It is also an object of the present invention to provide a mobile communication device having a balanced power amplifier the efficiency of which can be optimized so that the limitations and drawbacks associated with prior art are eliminated or reduced. It is also an object of the present invention to provide an amplifier module that can be used e.g. in a mobile communication device so that the limitations and drawbacks associated with prior art are eliminated or reduced. It is also an object of the present invention to provide a method for optimizing efficiency of a balanced power amplifier so that the limitations and drawbacks associated with prior art are eliminated or reduced.

The objectives of the invention are achieved with a solution in which a voltage level of an output signal of an amplifier stage is detected at a signal output of each amplifier stage and the detected voltage level values are used for controlling a supply voltage of each amplifier stage in a way that efficiency of a power amplifier is improved without increasing the risk for clipping the output signal of the power amplifier.

The invention yields appreciable benefits compared to prior art solutions:
  power losses in a power amplifier is reduced and, therefore, temperature of electrical components of the amplifier is also reduced,
  efficiency can be reliably optimized also in situations in which there in impedance mismatch between an output impedance of the amplifier and an input impedance of a load,
  realization is simple and cost effective; no need for directional switches for efficiency optimization.

In a battery energized mobile communication device reduction of power losses means an increase in an operation time between successive battery loadings.

A balanced power amplifier having an in-phase amplifier stage and a quadrature amplifier stage according to the invention is characterized in that the balanced power amplifier comprises:
  a first detector disposed to detect a voltage value of an in-phase signal, the in-phase signal being an output signal of the in-phase amplifier stage,
  a second detector disposed to detect a voltage value of a quadrature signal, the quadrature signal being an output signal of the quadrature amplifier stage,
  a controllable supply unit disposed to produce supply voltages for energizing the in-phase amplifier stage and for energizing the quadrature amplifier stage, and
  a control unit disposed determine a value of a supply voltage for energizing the in-phase amplifier stage at least partly according to said voltage value of the in-phase signal and to determine a value of a supply voltage for energizing the quadrature amplifier stage at least partly according to said voltage value of the quadrature signal.

A mobile communication device according to the invention is characterized in that it comprises:
  a first amplifier stage disposed to be an in-phase amplifier stage of a balanced power amplifier and a second amplifier stage disposed to be a quadrature amplifier stage of said balanced power amplifier,
  a first detector disposed to detect a voltage value of an in-phase signal, the in-phase signal being an output signal of the in-phase amplifier stage,
  a second detector disposed to detect a voltage value of a quadrature signal, the quadrature signal being an output signal of the quadrature amplifier stage,
  a controllable supply unit disposed to produce supply voltages for energizing the in-phase amplifier stage and for energizing the quadrature amplifier stage, and
  a control unit disposed determine a value of a supply voltage for energizing the in-phase amplifier stage at least partly according to said voltage value of the in-phase signal and to determine a value of a supply voltage for energizing the quadrature amplifier stage at least partly according to said voltage value of the quadrature signal.

An amplifier module according to the invention is characterized in that it comprises:
  a signal input terminal and a signal output terminal,
  a first amplifier stage coupled between the signal input terminal and the signal output terminal and disposed to be an in-phase amplifier stage of a balanced power amplifier,
  a second amplifier stage coupled between the signal input terminal and the signal output terminal and disposed to be a quadrature amplifier stage of said balanced power amplifier,
  a first detector disposed to detect a voltage value of an in-phase signal, the in-phase signal being an output signal of the in-phase amplifier stage,
  a second detector disposed to detect a voltage value of a quadrature signal, the quadrature signal being an output signal of the quadrature amplifier stage,
  a controllable supply unit disposed to produce supply voltages for energizing the in-phase amplifier stage and for energizing the quadrature amplifier stage, and
  a control unit disposed determine a value of a supply voltage for energizing the in-phase amplifier stage at least partly according to said voltage value of the in-phase signal and to determine a value of a supply voltage for energizing the quadrature amplifier stage at least partly according to said voltage value of the quadrature signal.

A method according to the invention for optimizing efficiency of a balanced power amplifier having an in-phase amplifier stage and a quadrature amplifier stage is characterized in that the method comprises:
  detecting a voltage value of an in-phase signal, the in-phase signal being an output signal of the in-phase amplifier stage, detecting a voltage value of a quadrature signal, the quadrature signal being an output signal of the quadrature amplifier stage, determining a first supply voltage value at least partly according to said voltage value of the in-phase signal, determining a second supply voltage value at least partly according to said voltage value of the quadrature signal, and setting a supply voltage of the in-phase amplifier stage to be the first supply voltage value and setting a supply voltage of the quadrature amplifier stage to be the second supply voltage value.

Features of various advantageous embodiments of the invention are described below.

The exemplary embodiments of the invention presented in this document are not to be interpreted to pose limitations to the applicability of the appended claims. The verb "to comprise" is used in this document as an open limitation that does not exclude the existence of also unrecited features. The features recited in depending claims are mutually freely combinable unless otherwise explicitly stated.

BRIEF DESCRIPTION OF THE FIGURES

The invention and its other advantages are explained in greater detail below with reference to the preferred embodiments presented in the sense of examples and with reference to the accompanying drawings, in which.

DETAILED DESCRIPTION OF THE PREFERRED EMBODIMENTS OF THE INVENTION

Figure 1:
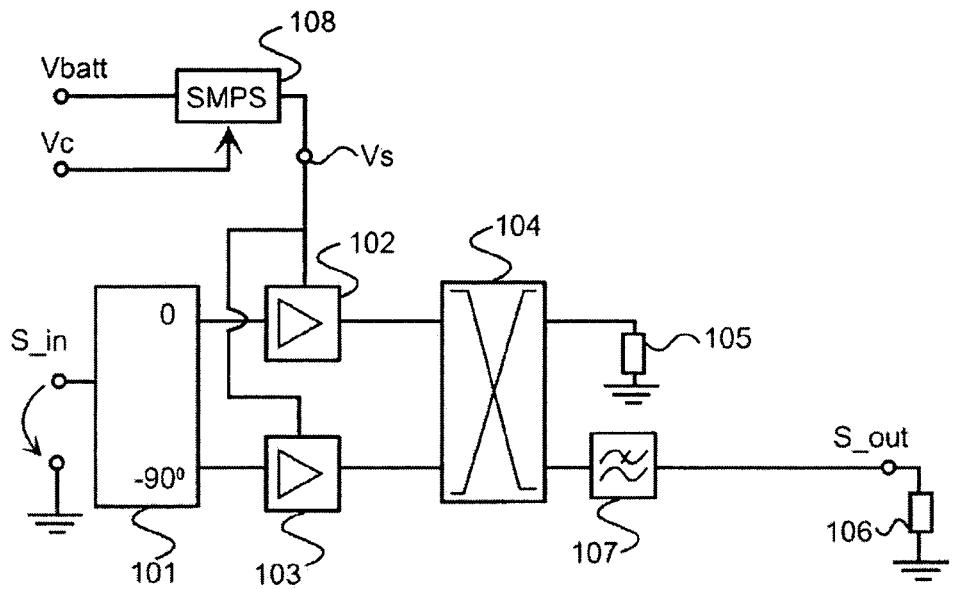
FIG. 1 shows a balanced power amplifier according to prior art.
Figure 2:
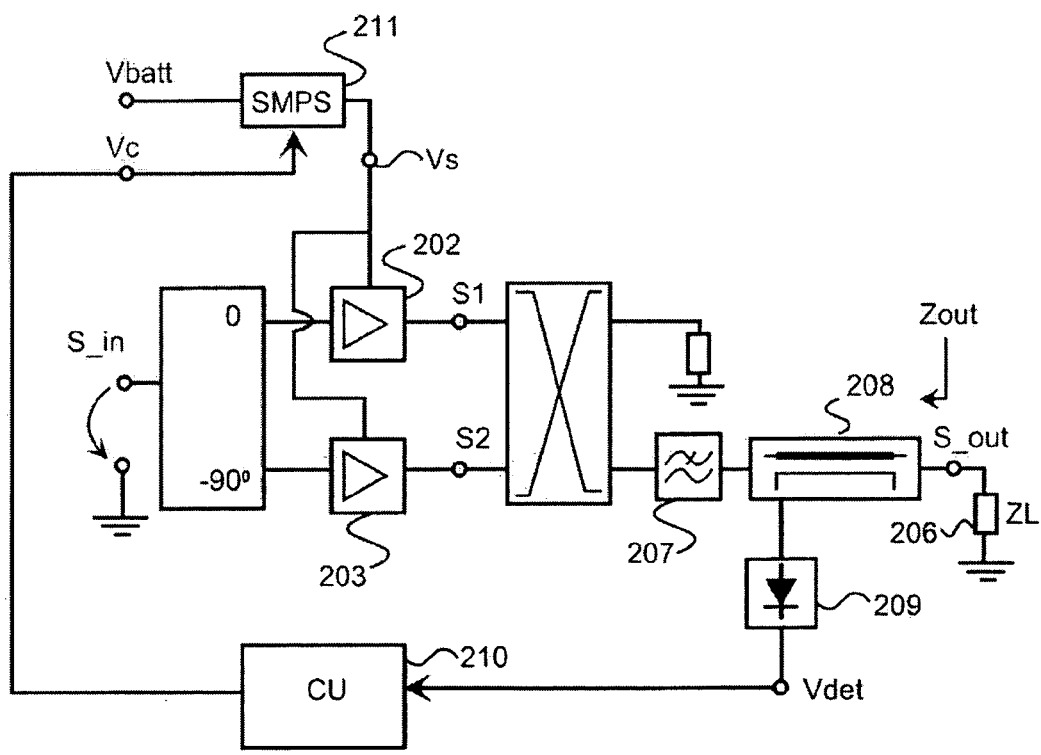
FIG. 2 shows a balanced power amplifier having a supply voltage control based on measured output power according to prior art.

FIGS. 1-2 have been explained above in the description of the prior art.

Figure 3:
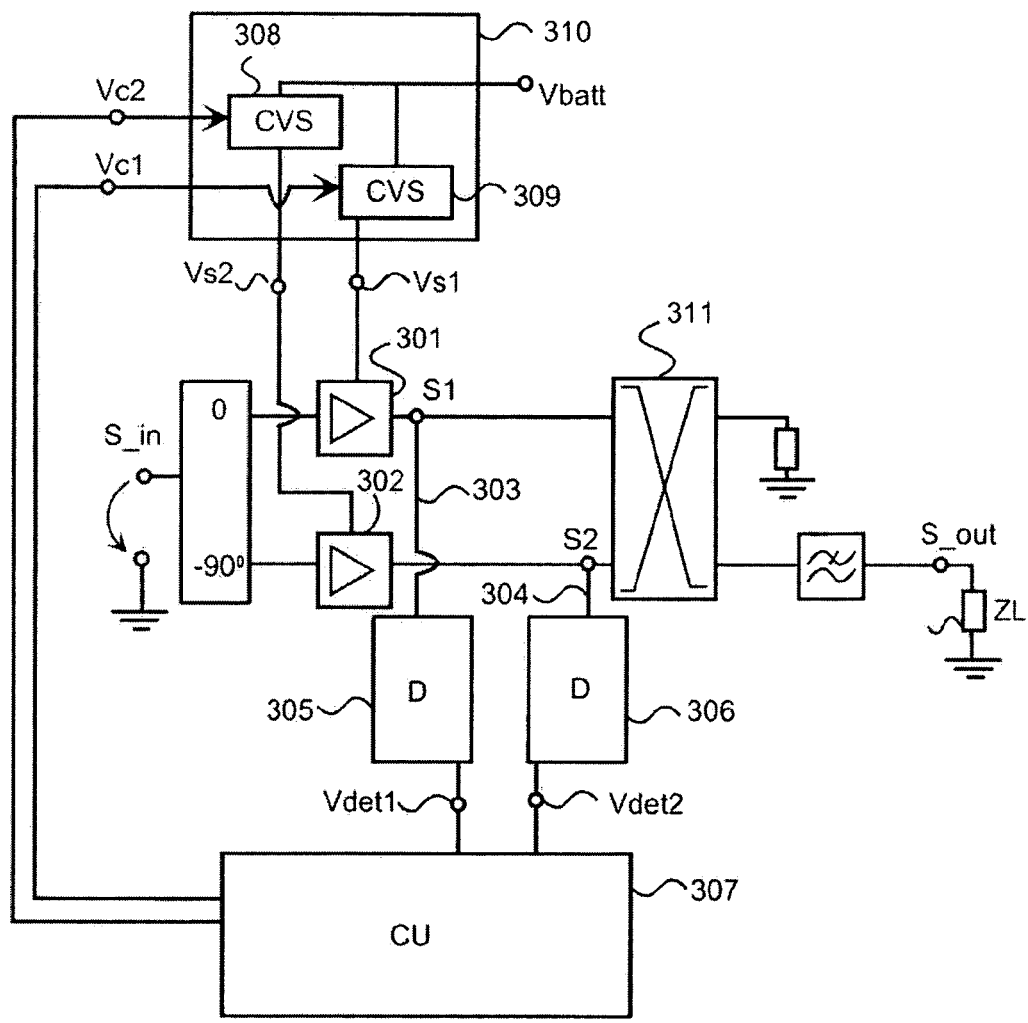
FIG. 3 shows a balanced power amplifier according to an embodiment of the invention.

FIG. 3 shows a balanced power amplifier according to an embodiment of the invention. The balanced power amplifier comprises an in-phase amplifier stage 301 and a quadrature amplifier stage 302. Supply voltages Vs1 and Vs2 for the in-phase and quadrature amplifier stages 301 and 302 are produced with a controllable supply unit 310. The controllable supply unit 310 comprises two controllable voltage sources 308 and 309 that can be for example switched mode power supplies (SMPS) according to prior art or linear regulators according to prior art. A type of the controllable voltage sources is immaterial from the viewpoint of the invention. In the remainder of this document an output signal S1 of the in-phase amplifier stage 301 is called an in-phase signal and an output signal S2 of the quadrature amplifier stage 302 is called a quadrature signal. The in-phase signal S1 is conducted via a signal path 303 to a detector 305. The quadrature signal S2 is conducted via a signal path 304 to a detector 306. Output signals Vdet1 and Vdet2 of the detectors 305 and 306, respectively, are conducted to a control unit 307. The control unit 307 is disposed to form a control voltage Vc1 that determines a value of the supply voltage Vs1 at least partly according to the output signal Vdet1 of the detector 305 and to form a control voltage Vc2 that determines a value of the supply voltage Vs2 at least partly according to the output signal Vdet2 of the detector 306 in a way that the efficiency of the balanced power amplifier is optimized but clipping of the in-phase and quadrature signals S1 and S2 does not occur.

Figure 4A:
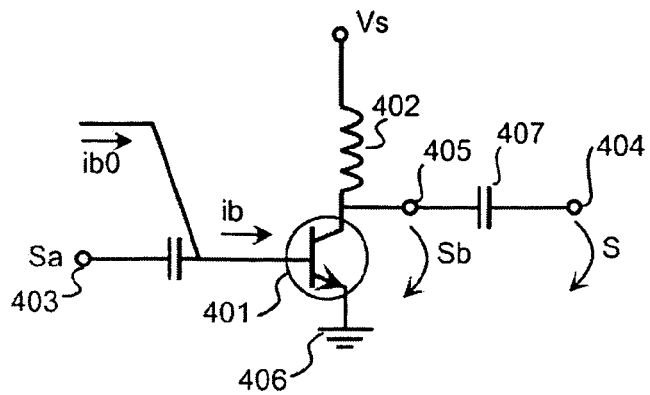
FIG. 4a shows an exemplary amplifier stage that can be used in a balanced power amplifier according to an embodiment of the invention.
Figure 4B:
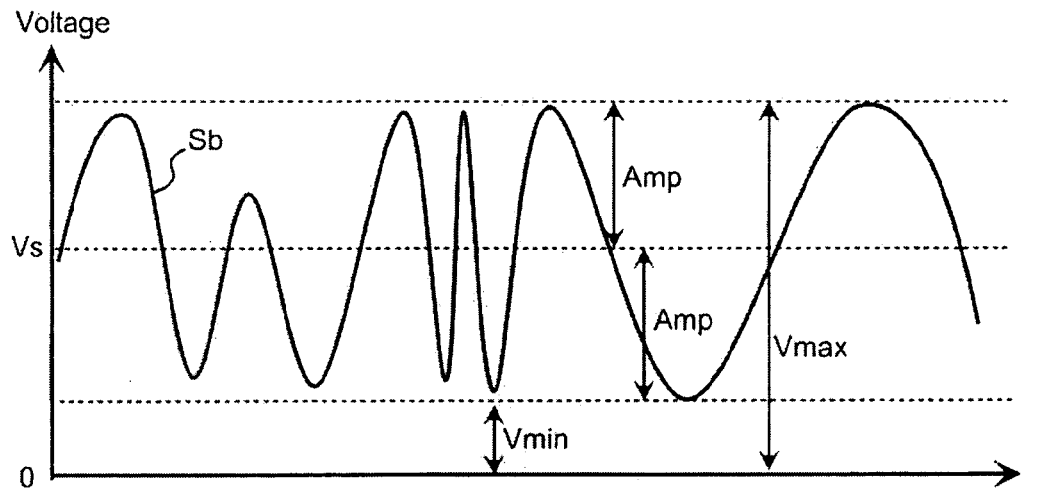
FIGS. 4b and 4c show exemplary signal waveforms in an amplifier stage of a balanced power amplifier according to an embodiment of the invention.
Figure 4C:
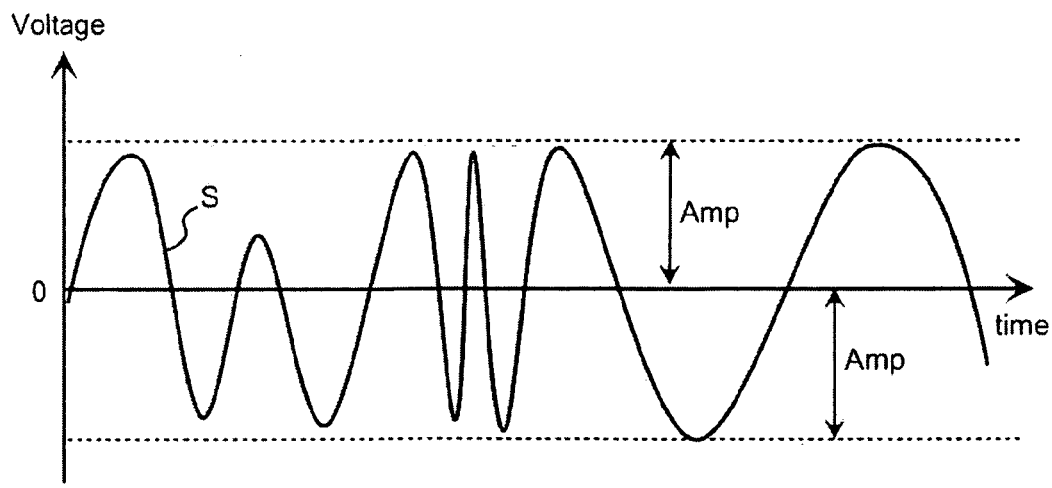

Principles according to which the supply voltages Vs1 and Vs2 can be controlled in a balanced power amplifier according to an embodiment of the invention are illustrated with the aid of FIGS. 4a, 4b and 4c. FIG. 4a shows an amplifier stage. The in-phase amplifier stage 301 and the quadrature amplifier stage 302 in FIG. 3 can be accordant with the one shown in FIG. 4a. The amplifier stage shown in FIG. 4a comprises an output stage transistor 401 and an ac-decoupling inductor 402 that couples the output stage transistor to a supply voltage Vs. In this case the supply voltage Vs is assumed to be positive in respect of a ground potential 406. Alternatively, an amplifier stage can be constructed to use a negative supply voltage. In the analysis below we, however, assume that the supply voltage is positive. A person skilled to art is able make a corresponding analysis also for an amplifier stage with a negative supply voltage.

An input signal Sa of the amplifier stage is received at an input terminal 403 and an output signal S of the amplifier stage is taken out from an output terminal 404. An operating point of the transistor is determined by operating point base current ib0 and by the supply voltage Vs. The operating point base current ib0 represents a dc-component of a base current ib. The supply voltage Vs is wanted to be as low as possible in order to minimize power losses in the amplifier stage. On the other hand, the supply voltage Vs has to be so high that the output signal S is not distorted due to clipping. FIG. 4a shows an amplifier stage based on one bipolar transistor. An amplifier stage used in a balanced power amplifier according to an embodiment of the invention can also be based on more than one bipolar transistor, e.g. a Darlington connection, or one or more field effect transistor (FET), or a combination of one or more bipolar transistor and one or more FET.

FIG. 4b shows an exemplary signal Sb that prevails between a terminal 405 and the ground potential 406. A dc-component of the signal Sb is the supply voltage Vs. In FIG. 4b Vmax denotes a maximum potential difference between the signal Sb and the ground potential 406 and Vmin denotes a minimum potential difference between the signal Sb and the ground potential 406. A smallest possible value for the signal Sb is reached when the base current ib has so big a value that the output stage transistor 401 substantially short-circuits the terminal 405 to the ground potential 406. Therefore, the Signal Sb is never below the ground potential 406. A waveform of the signal Sb is clipped if the supply voltage Vs is decreased with a value greater than Vmin, because the dc-component of Sb would be decreased with the same value and the signal Sb cannot be below the ground potential 406.

FIG. 4c shows a signal S that prevails between a terminal 404 and the ground potential 406. The signal S is obtained by removing the dc-component from the signal Sb with a dc-decoupling capacitor 407, i.e. the signal S is an ac-component of the signal Sb. The terminal 404 is assumed to be loaded, but circuitry loading the terminal 404 is not shown in FIG. 4a. When a power amplifier is used in a transmitter of a communication device and when the signal Sb is not clipped it can be assumed the signal Sb is symmetrical around its dc-component Vs, i.e. Vmax−Vs=Vs−Vmin. In FIGS. 4b and 4c Amp denotes an amplitude of an ac-component of the signal Sb, i.e. an amplitude of the signal S. Also in conjunction with the signal S the amplitude can be defined to be the amplitude of an ac-component of the signal in spite of the fact that the ac-component of the signal S is substantially zero.

At least when the above-mentioned assumption of symmetry is valid a fact that Vmin≧0 means that $$Vs \geq Amp \quad (1)$$

and $$Vs \geq Vmax/2. \quad (2)$$

The above analysis was simplified in the sense that a resistance of the ac-decoupling inductor 402 was assumed to be zero and it was assumed that the output stage transistor 401 is able to form a short circuit between the terminal 405 to the ground potential 406. Due to the fact that in practical cases these assumptions are not valid, a safety margin M is needed for the minimum potential difference Vmin. In other words, it is not sufficient to require that Vmin≧0, but it has to be required that Vmin is greater than a safety margin M, i.e.

$$Vmin \geq M, \quad (3)$$

$$Vs\_low = Amp + M, \quad (4)$$

and $$Vs\_low = Vmax/2 + M, \quad (5)$$

where Vs_low means a minimum allowable value for the supply voltage Vs in order to avoid clipping of the signals Sb and S. In order to minimize power losses in the amplifier stage shown in FIG. 4a a value of the supply voltage is set to Vs_low, i.e. Vs=Vs_low.

It should be noted that if the signal Sb is clipped Vs_low given by equation (4) or (5) is not necessarily a supply voltage value that leads to a situation in which Vmin=M, because the equations (1)-(5) were derived with an assumption that no clipping occurs. For example, let us assume a situation in which the signal Sb is clipped and we detect a maximum potential difference Vmax. As the signal Sb is clipped the supply voltage Vs is less than Vmax/2+M. Therefore, when the supply voltage is set to a value Vs_low according to equation (5) the supply voltage is increased. As clipping occurred and the supply voltage was increased the maximum potential difference Vmax increases; clipping is mitigated or eliminated. Therefore, the detected Vmax increases and again the supply voltage according to equation (5) is increased. This leads to a situation in which the supply voltage is increased as long as the detected maximum potential difference Vmax satisfies equation (5). A similar analysis can be presented also for a case in which equation (4) is applied.

Figure 4D:
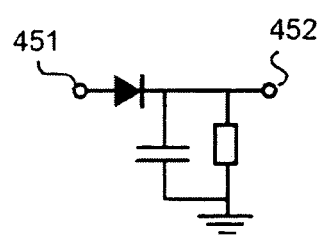
FIGS. 4d and 4e show exemplary detectors that can be used in a balanced power amplifier according to an embodiment of the invention.

The maximum potential difference Vmax between the signal Sb and the ground potential 406 can be obtained for example with a diode envelope detector shown in FIG. 4d, wherein the signal Sb is connected to a terminal 451 and an output signal Vmax of the detector is available at a terminal 452. Also the amplitude Amp of the signal S can be obtained with a diode envelope detector shown in FIG. 4d, wherein the signal S is connected to a terminal 451 and an output signal Amp of the detector is available at a terminal 452. The amplitude Amp of the ac-component of the signal Sb can be obtained for example with a detector that comprises a high pass filter that removes the dc-component from the signal Sb and a diode envelope detector. The minimum potential difference Vmin between the signal Sb and the ground potential 406 can be obtained for example with a diode envelope detector shown in FIG. 4e, wherein the signal Sb is connected to a terminal 461 and an output signal Vmin of the detector is available at a terminal 462. A time constant of a resistor-capacitor (RC) circuit of the detector shown in FIG. 4d or 4e is selected so that the output signal of the detector is able to follow changes in the maximum potential difference Vmax, in the amplitude Amp, or in the minimum potential difference Vmin with a sufficient rate.

The invention does not limit the implementation of detectors 305 and 306 shown in FIG. 3. Any suitable detectors can be used like the above-mentioned diode envelope detectors, detectors implemented with a mixer and a phaser, or detectors based on logarithmic amplifiers.

Figure 4E:
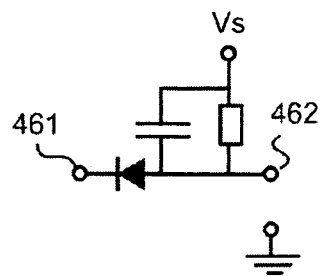

A disadvantage of the diode envelope detectors shown in FIGS. 4d and 4e is the fact that in many applications accuracy requirements force the use of special and expensive detector diodes having a low threshold voltage. The diode realizations shown in FIGS. 4d and 4e can be, however, replaced with realizations based on standard radio frequency (RF) transistors. For example, the diode envelope detector shown in FIG. 4d can be replaced with a transistor detector described in U.S. Pat. No. 5,214,372 that is incorporated herein as a reference.

The safety margin M can be a constant or the safety margin M can be a function of the supply voltage Vs and/or of the detected value Vmin, Vmax or Amp. For example, the safety margin can be increased when the supply voltage is increased because effect of parasitic elements, like a power loss in the ac-decoupling inductor, increases when signal level increases. For example, the safety margin M used in the equations (3)-(5) can be given by a formula M=M0+α×Vs, where M0 and α are constants.

In a balanced power amplifier according to an embodiment of the invention the in-phase signal S1 and the quadrature signal S2 in FIG. 3 have non-zero dc-components according to FIG. 4b. In this case dc-decoupling capacitors in signal paths for the in-phase signal S1 and for the quadrature signal S2, respectively, are located in a 3 dB hybrid 311. The output signal Vdet1 of the detector 305 is the maximum potential difference Vmax between the in-phase signal and a ground potential. The output signal Vdet2 of the detector 306 is the maximum potential difference Vmax between the quadrature signal S2 and a ground potential. Values for the supply voltages Vs1 and Vs2 are determined according to equation (5).

In a balanced power amplifier according to an embodiment of the invention the in-phase signal S1 and the quadrature signal S2 in FIG. 3 have non-zero dc-components according to FIG. 4b. In this case dc-decoupling capacitors in signal paths for the in-phase signal S1 and for the quadrature signal S2, respectively, are located in a 3 dB hybrid 311. The output signal Vdet1 of the detector 305 is the minimum potential difference Vmin between the in-phase signal and a ground potential. The output signal Vdet2 of the detector 306 is the minimum potential difference Vmin between the quadrature signal S2 and a ground potential. Value for the supply voltages Vs1 and Vs2 are determined according to the following rule:

if Vmin is smaller than a safety margin M a supply voltage is increased by a value of M−Vmin, if Vmin is greater than the safety margin M the supply voltage is decreased by a value of Vmin−M.

In a balanced power amplifier according to an embodiment of the invention the in-phase signal S1 and the quadrature signal S2 in FIG. 3 have non-zero dc-components according to FIG. 4b. In this case dc-decoupling capacitors in signal paths for the in-phase signal S1 and for the quadrature signal S2, respectively, are located in a 3 dB hybrid 311. The output signal Vdet1 of the detector 305 is an amplitude of an ac-component of the in-phase signal S1. The output signal Vdet2 of the detector 306 is an amplitude of an ac-component of the quadrature signal S2. Values for the supply voltages Vs1 and Vs2 are determined according to equation (4).

In a balanced power amplifier according to an embodiment of the invention the in-phase signal S1 and the quadrature signal S2 in FIG. 3 have zero dc-components according to FIG. 4c. In this case dc-decoupling capacitors in signal paths for the in-phase signal S1 and for the quadrature signal S2 are located in the in-phase amplifier stage 301 and in the quadrature amplifier stage 302, respectively. The output signal Vdet1 of the detector 305 is an amplitude of the in-phase signal S1. The output signal Vdet2 of the detector 306 is an amplitude of the quadrature signal S2. Values for the supply voltages Vs1 and Vs2 are determined according to equation (4).

There are numerous others ways than those mentioned above to determine values of supply voltages for an in-phase amplifier stage and for a quadrature amplifier stage of a balanced power amplifier according to an embodiment of the invention. For example, an output signal of a detector can be an effective value, e.g. a root mean square, of an in-phase or quadrature signal and an estimate for an amplitude of an ac-component of the in-phase or quadrature signal is obtained with the effective value and a with á priori known crest factor of the in-phase or quadrature signal.

A common feature for all the methods is the fact that the determination of the supply voltages is based on detected voltage values of the in-phase signal and the quadrature signal. As described above the voltage value can be one of many alternatives like a maximum potential difference, a minimum potential difference, an amplitude of an ac-component, and an effective value. The detected voltage values indicate both an effect of a signal power propagating towards a load of the balanced power amplifier and an effect of a reflected signal power. Therefore, possible impedance mismatch on a signal path from the in-phase and quadrature amplifier stages to the load does not disturb optimal control of supply voltages.

In a balanced power amplifier according to an embodiment of the invention a value for the supply voltage Vs1 is determined with a different method than a value of the supply voltage Vs2.

In a balanced power amplifier according to one embodiment of the invention a same supply voltage is used for energizing both the in-phase amplifier stage 301 and the quadrature amplifier stage 302 in FIG. 3, i.e. Vs1=Vs2=Vs. A value for the supply voltage common for both the in-phase amplifier stage 301 and the quadrature amplifier stage 302 is determined according to the following rule:

$$Vs = \max\{Vs\_low1, Vs\_low2\}, \quad (6)$$

where $\max\{\cdot,\cdot\}$ means a maximum of its arguments and Vs_low1 is a minimum allowable supply voltage for the in-phase amplifier stage 301 that is obtained with any of the above-described methods and Vs_low2 is a minimum allowable supply voltage for the quadrature amplifier stage 302 that is obtained with any of the above-described methods When the efficiency of the balanced power amplifier shown in FIG. 3 is optimized by controlling supply voltages Vs1 and/or Vs2 operating points of output stage transistors of the in-phase amplifier stage 301 and/or the quadrature amplifier stage 302 are changed. As a consequence, a gain of the balanced power amplifier may also be changed. In some cases a changed gain can equal a desired gain for a new situation corresponding with changed levels of the in-phase and quadrature signals S1 and S2, but the changed gain can also be too small or too big for the new situation. Undesirable variations in the gain can be compensated with a controllable gain unit that is disposed to adapt a level of an input signal S_in of the balanced power amplifier. The controllable gain unit is not shown in FIG. 3.

A balanced power amplifier according to an embodiment of the invention comprises a controllable gain unit at a signal input of the balanced power amplifier. The controllable gain unit is disposed to compensate at least partly a change in a gain of the balanced power amplifier due to a change in supply voltages of an in-phase amplifier stage and/or a quadrature amplifier stage. The controllable gain unit can be controlled e.g. with the aid of a measured output power of the balanced power amplifier, where the output power can be measured e.g. with a directional switch. The controllable gain unit can be a variable gain amplifier according to prior art.

A value of the operating point base current ib0 shown in FIG. 4a, i.e. biasing of the amplifier stage, has an effect on linearity of the amplifier stage and also an effect on the efficiency of the amplifier stage. When the operating point base current ib0 is increased, i.e. the biasing is increased, the linearity of the amplifier stage is improved but the efficiency gets lower and vice versa. Good linearity is important especially with small levels of the output signal S, whereas good efficiency is important with high levels of the output signal S. Therefore, the biasing of the amplifier stage can be controlled at least partly according to the level of the output signal S in a way that biasing is decreased (increased) when the level of the output signal S is increased (decreased). For an amplifier stage based on a FET the biasing of the amplifier stage means selecting a value of an operating point gate voltage, i.e. a dc-component of the gate voltage.

In a balanced power amplifier according to an embodiment of the invention biasing of an in-phase amplifier stage is controlled at least partly according to a detected voltage value of the in-phase signal and biasing of a quadrature amplifier stage is controlled at least partly according to a detected voltage value of the quadrature signal.

Figure 5:
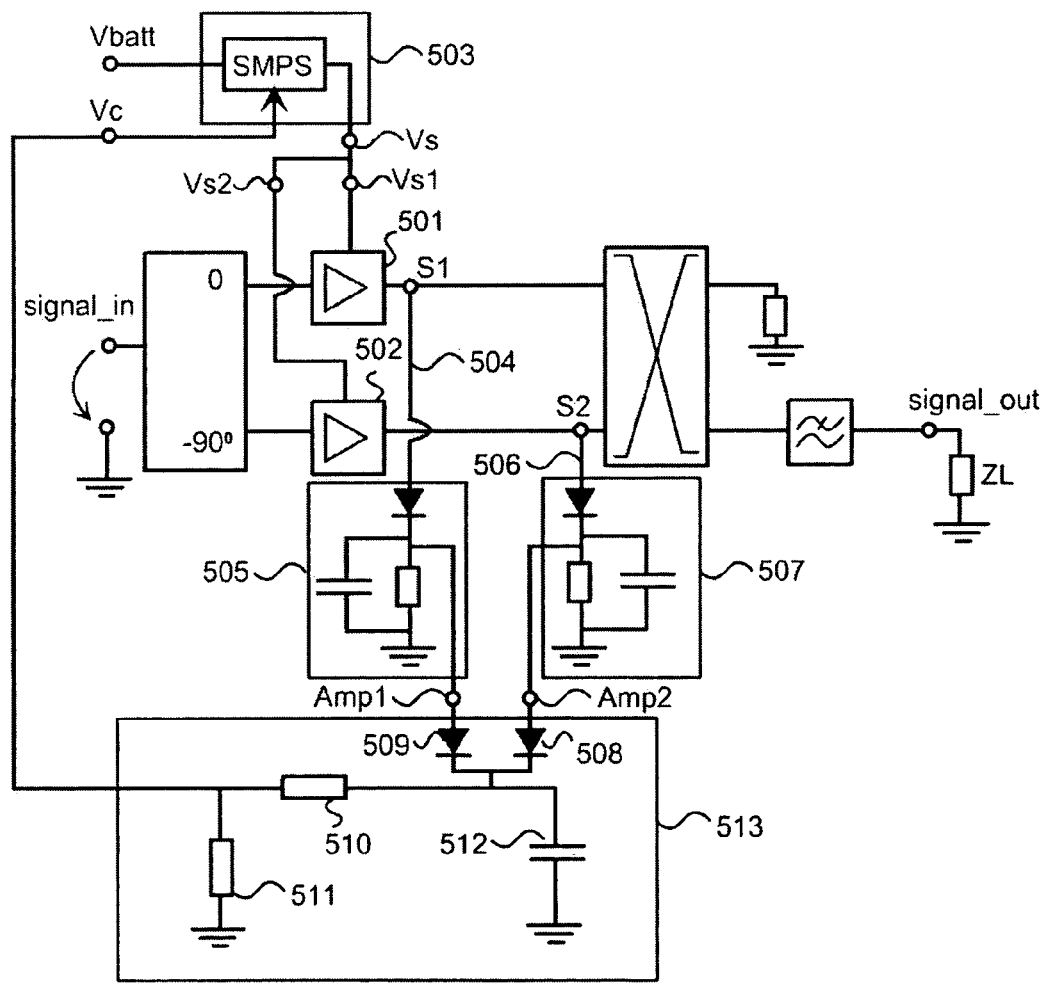
FIG. 5 shows a balanced power amplifier according to an embodiment of the invention.

FIG. 5 shows a balanced power amplifier according to an embodiment of the invention. In this embodiment of the invention a supply voltage Vs1 for energizing an in-phase amplifier stage 501 and a supply voltage Vs2 for energizing a quadrature amplifier stage 502 are arranged to be a common supply voltage Vs. The supply voltage Vs is produced with a controllable supply unit 503 that comprises a switched mode power supply (SMPS). A dc-component of an in-phase signal S1 and a dc-component of a quadrature signal S2 are assumed to be substantially zero, i.e. accordant to FIG. 4c. The in-phase signal S1 is conducted via a signal path 504 to a diode envelope detector 505 that is disposed to detect an amplitude Amp1 of the in-phase signal S1. The quadrature signal S2 is conducted via a signal path 506 to a diode envelope detector 507 that is disposed to detect an amplitude Amp2 of the quadrature signal S2. As the supply voltage Vs is common for both of the amplifier stages 501 and 502 the supply voltage has to be selected so that no clipping occurs in either of the in-phase and quadrature signals S1 and S2. Setting a minimum allowable value Vs_low for the supply voltage Vs according to the following rule fulfils this requirement:

$$Vs\_low = \max\{Amp1, Amp2\} + M, \qquad (7)$$

where and M is a safety margin. The supply voltage Vs is adjusted to the value Vs_low with the controllable supply unit 503 in order to maximize the efficiency of the balanced power amplifier.

The max-function in equation (7) is realized with a control unit 513 that comprises diodes 508 and 509 and an RC-circuit composed of resistors 510 and 511 and a capacitor 512. A time constant of the RC-circuit is chosen so that the max-function is able to follow changes in Amp1 and Amp2 with a sufficient rate. A dynamical range of an output signal Vc of the control unit 513 is adapted to be suitable for the controllable supply unit 503 using voltage division accomplished with the resistors 510 and 511. A safety margin M in equation (7) can have a form $M = \alpha \times \max\{Amp1, Amp2\}$. In this case the margin can be realized with the resistors 510 and 511. It is also possible that the controllable supply unit 503 has been adapted to produce the supply voltage Vs as $k \times Vc + V0$, where k is a gain and V0 is a constant voltage. In this case the margin can have a form $M = \alpha \times \max\{Amp1, Amp2\} + V0$.

Properties of the diode envelope detectors 505 and 507 and the control unit 513 are to some extent dependent on temperature. The temperature dependency causes inaccuracy in detecting the amplitudes of the in-phase and quadrature signals S1 and S2. Therefore, the supply voltage Vs has undesired temperature dependency. This kind of inaccuracy causes a need for a higher value of the margin M in order to be sure that clipping of the in-phase and quadrature signals S1 and S2 does not occur. A higher value of the margin M means a higher value of the supply voltage Vs and lower efficiency of the power amplifier.

Figure 6:
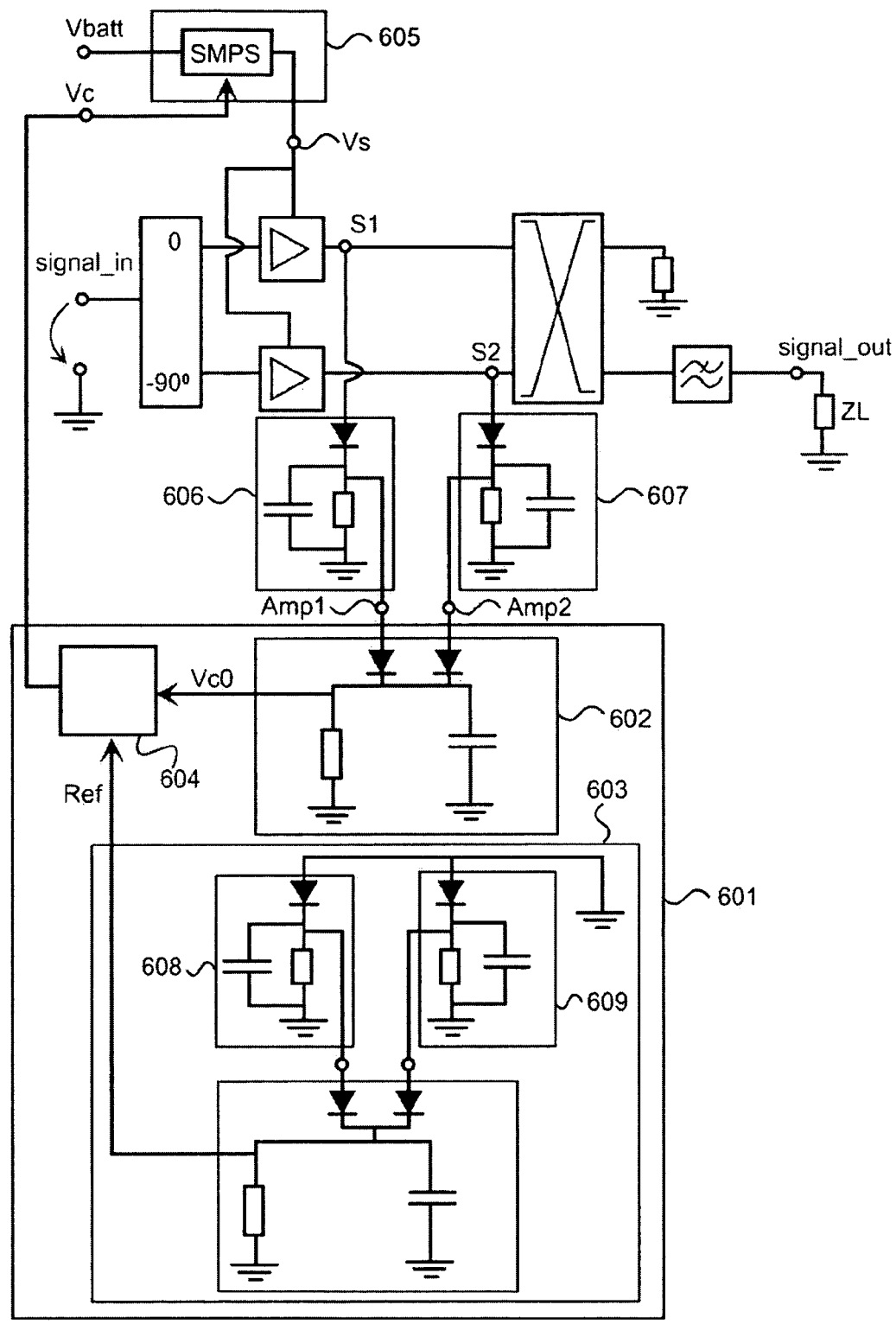
FIG. 6 shows a balanced power amplifier according to an embodiment of the invention.

FIG. 6 shows a balanced power amplifier according to an embodiment of the invention. In this embodiment of the invention a control unit 601 comprises a function element 602 that produces a maximum of detected amplitudes of the an in-phase signal S1 and a quadrature signal S2, a reference element 603 that produces a reference signal Ref, and an output element 604 that produces a control voltage Vc for a controllable supply unit 605. The reference element 603 is similar to a combination of diode envelope detectors 606 and 607 and the function element 602, but inputs of devices 608 and 609 that correspond with the diode envelope detectors 606 and 607 are coupled to a ground potential. The output element 604 uses a signal Vc0 that is an output of the function element 602 and the reference signal Ref for determining the control voltage Vc. Temperature dependency of the combination of the diode envelope detectors 606 and 607 and the function element 602 is with a good accuracy similar to that of the reference element 604. Therefore, level variations due to temperature variations can be at least partly cancelled by subtracting the reference signal Ref from the signal Vc0, i.e. Vc0−Ref. The out-put element 604 can be for example an amplifier having a differential input terminal.

Figure 7:
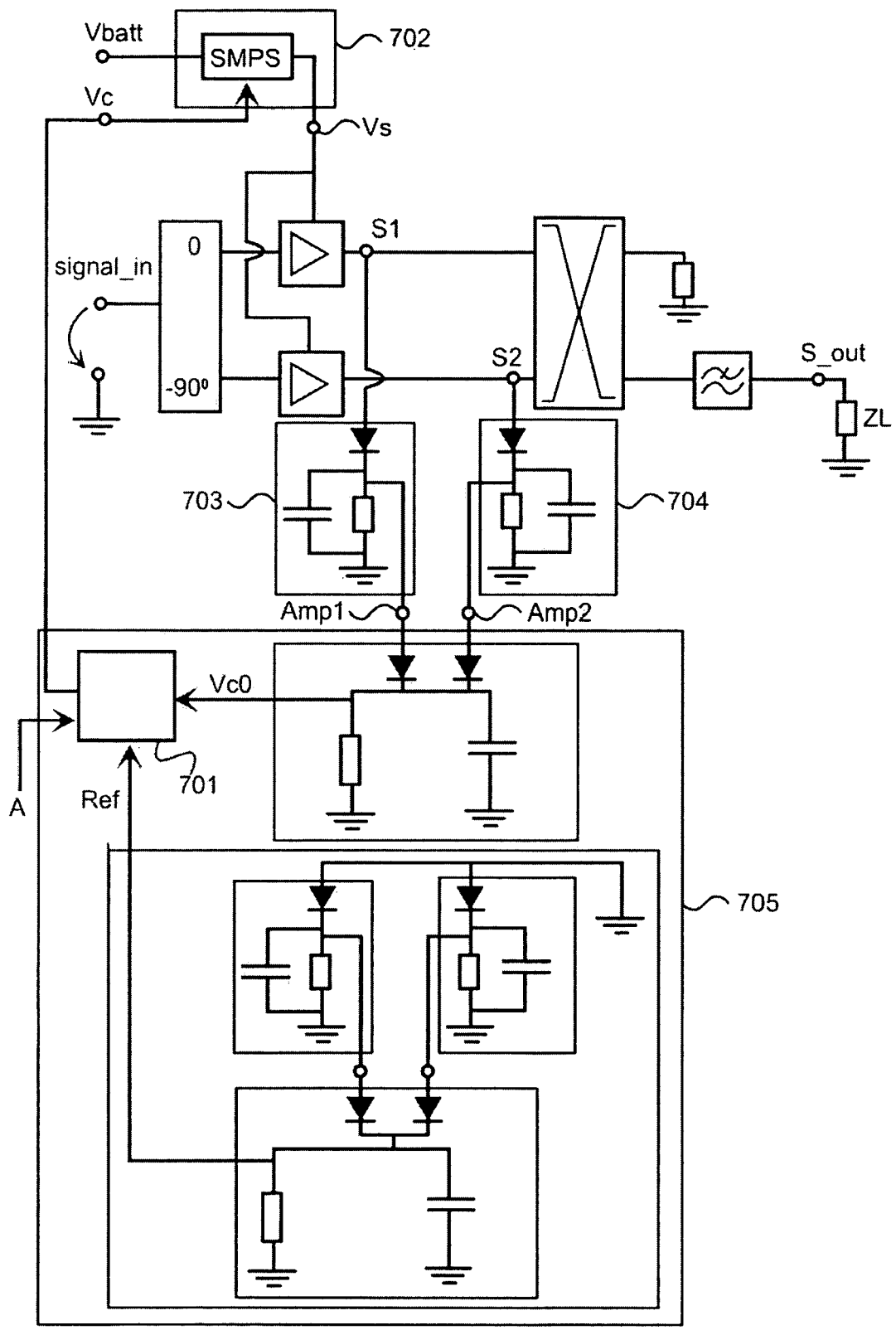
FIG. 7 shows a balanced power amplifier according to an embodiment of the invention.

FIG. 7 shows a balanced power amplifier according to an embodiment of the invention. In this embodiment of the invention an output element 701 of a control unit 705 produces a control voltage Vc for a controllable supply unit 702 according to quantities Vc0, Ref, and A, where Vc0 is a maximum of detected amplitudes max {Amp1, Amp2}, Ref is a reference signal of the kind described above in conjunction with FIG. 6, and A is an external control signal that is used for controlling a supply voltage Vs according to external information. In many applications, power of an output signal S_out of the balanced power amplifier varies over time. This kind of situation is present for example in a transmitter in which a modulation scheme comprises an amplitude modulation (AM) component. When a supply voltage Vs is controlled according to the detected amplitudes Amp1 and Amp2 changes in a value of the supply voltage Vs are always delayed in respect of corresponding changes in the amplitudes, because a change in the amplitudes can be detected only after the change has occurred. Furthermore, in practical realizations there is always a delay in an information path through a diode envelope detector 703 or 704, through the control unit 705, and through the controllable supply unit 702. Therefore, a safety margin in the supply voltage Vs, e.g. M in equation (7), has to be so high that clipping of the signals S1 and S2 does not occur after an increase in the amplitudes of the signals S1 and S2 even if a corresponding increase in the supply voltage is delayed. The control signal A can be used for providing information about changes in the amplitudes so that the above-mentioned delay can be shortened. For example, the external control signal A can represent an AM-component of a modulation scheme in which an envelope tracking (ET) or an envelope elimination and restoration (EER) technique is used. When the delay is shortened the safety margin in the supply voltage can be reduced thus providing an improvement in the efficiency of the balanced power amplifier. In order to optimize the efficiency of the balanced power amplifier a value of the control voltage Vc is determined for example according to the following equation:

$$Vc = \alpha \times [HPF\{A\} + (Vc0 - Ref) + M], \qquad (8)$$

Where $\alpha$ is a constant and HPF$\{\cdot\}$ means high-pass filtering. The constant $\alpha$ is used for making a dynamical range of Vc to be suitable for the controllable supply unit 702. The high-pass filtering means that only changes of A have an effect on the control voltage Vc. When A is unchanged the control voltage Vc is determined according to only the maximum of the detected amplitudes Amp1 and Amp1. The output element 701 of the control unit 705 can be realized with an amplifier having a differential input terminal and with standard operational amplifiers.

Figure 8:
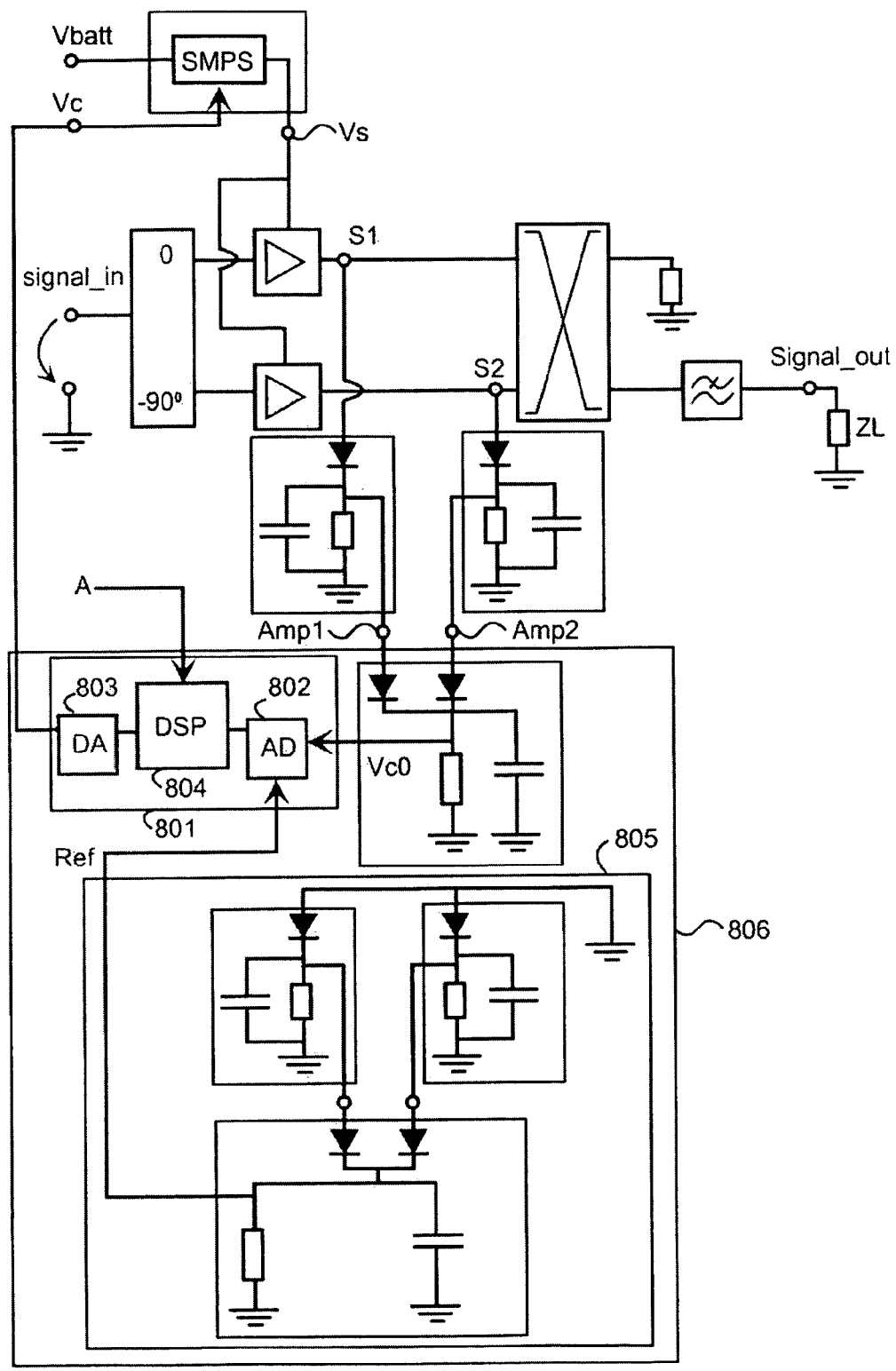
FIG. 8 shows a balanced power amplifier according to an embodiment of the invention.

FIG. 8 shows a balanced power amplifier according to an embodiment of the invention. In this embodiment of the invention an output element 801 of the control unit 806 comprises an analogue-to-digital converter (AD) 802, a digital-to-analogue converter (DA) 803, and a digital signal processor (DSP) 804. An output signal Ref of a reference element 805 is used as a reference level for the AD-converter 802. An external control signal A is supplied to the DSP 804 in a digital form. A function corresponding with equation (8) is realized with digital signal processing means of the DSP 804. The DSP 804 can be a programmable processor associated with a memory circuit containing software readable for the programmable processor. Alternatively the DSP 804 can be an application specific integrated circuit (ASIC) or the DSP 804 can be a combination of a programmable processor and an ASIC.

Figure 9:
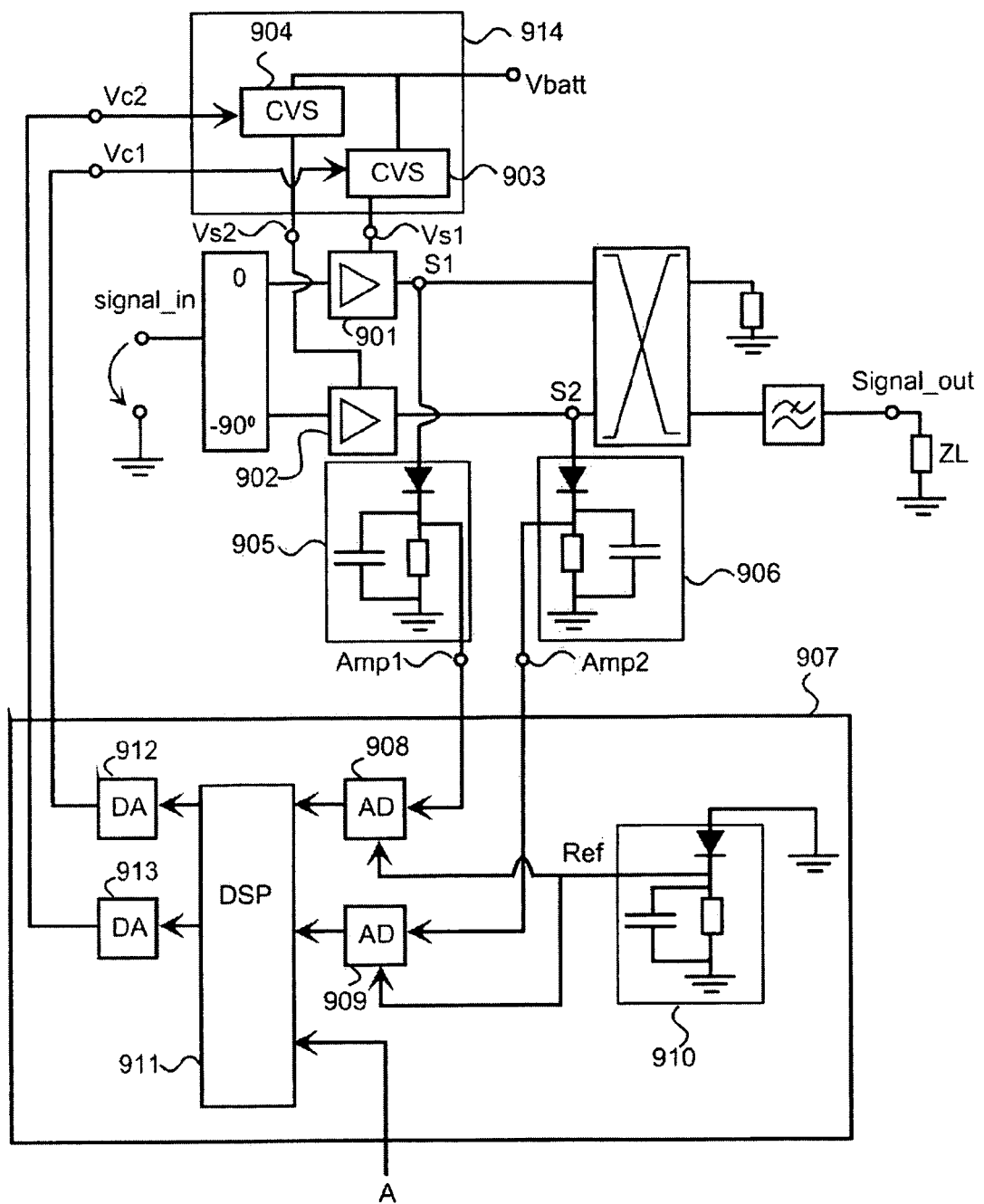
FIG. 9 shows a balanced power amplifier according to an embodiment of the invention.

FIG. 9 shows a balanced power amplifier according to an embodiment of the invention. An in-phase amplifier stage 901 and a quadrature amplifier stage 902 are energized with a controllable supply unit 914 that comprises controllable voltage sources 903 and 904. The controllable voltage source 903 produces a supply voltage Vs1 for the in-phase amplifier stage 901 and the controllable voltage source 904 produces a supply voltage Vs2 for the quadrature amplifier stage 902. A dc-component of an in-phase signal S1 and a dc-component of a quadrature signal S2 are assumed to be substantially zero, i.e. accordant to FIG. 4c. An amplitude Amp1 of the in-phase signal S1 and an amplitude Amp2 of the quadrature signal S2 are detected with diode envelope detectors 905 and 906, respectively. A control unit 907 comprises AD-converters 908 and 909 that convert the amplitude Amp1 and the amplitude Amp2 into a digital form and a reference element 910 that forms a reference signal Ref for the AD-converters 908 and 909. The reference element 910 is similar to the diode envelope detectors 905 and 906 but its input terminal is coupled to a ground potential. The reference signal Ref is used for compensating undesired temperature dependencies of the supply voltages Vs1 and Vs2. The control unit comprises a digital signal processor (DSP) 911 and DA-converters 912 and 913 that produce control voltages Vc1 and Vc2 for the controllable voltage sources 903 and 904. An external control signal A is supplied to the DSP 911 in a digital form. In order to optimize the efficiency of the balanced power amplifier values of the supply voltages Vs1 and Vs2 are determined for example according to the following equations using the AD-converters 908 and 909, the DSP 911, the DA-converters 912 and 913, and the controllable supply unit 914:

$$Vs1=\alpha \times HPF\{A\}+(Amp1-Ref)+M1 \text{ and}$$

$$Vs2=\alpha \times HPF\{A\}+(Amp2-Ref)+M2, \quad (9)$$

where M1 and M2 are safety margins which in a general case do not need to be equal and α is a constant.

Figure 10:
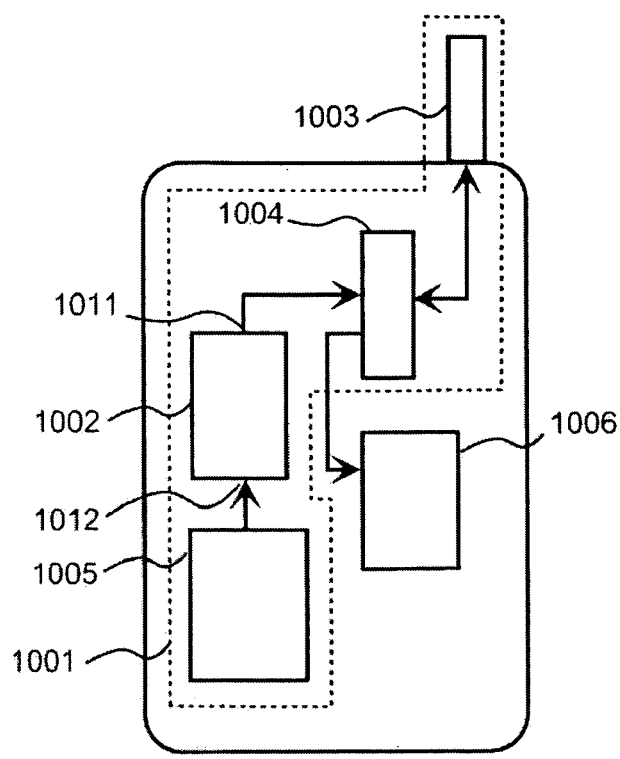
FIG. 10 shows a mobile communication device according to an embodiment of the invention.

FIG. 10 shows a mobile communication device according to an embodiment of the invention. A transmitter 1001 of the mobile communication device comprises a balanced power amplifier 1002 according to any of the embodiments described above and with the aid of FIGS. 3-9. A signal output interface 1011 of the balanced power amplifier 1002 is coupled to an antenna 1003 via a duplexer and antenna front-end element 1004. A block 1005 represents all the parts of the mobile communication device that provides an RF-input signal to a signal input interface 1012 of the balanced power amplifier 1002, e.g. a microphone, an analogue-to-digital converter, a codec, an up-modulator, etc. A block 1006 represents all the parts of the mobile communication device that process a signal received from the antenna 1003 via the duplexer and antenna front-end element 1004, e.g. a demodulator, equalizers, filtering systems, controllers, a speaker, etc.

Furthermore, the mobile communication device may comprise a controllable gain unit that compensates undesirable variations in a gain of the balanced power amplifier 1002 caused by changes in operating points of output stage transistors of the balanced power amplifier. The controllable gain unit can be located in the block 1005. In the mobile communication device it is possible to amplify or attenuate a base band signal with the controllable gain unit, i.e. before up-modulation. In this case the controllable gain unit does not have to be able to handle high frequency (RF) signals. In certain mobile communication devices according to an embodiment of the invention a base band signal is available also in a digital form. In this kind of case the compensation can be performed with digital signal processing means.

The mobile communication device can be for example a mobile phone.

Figure 11:
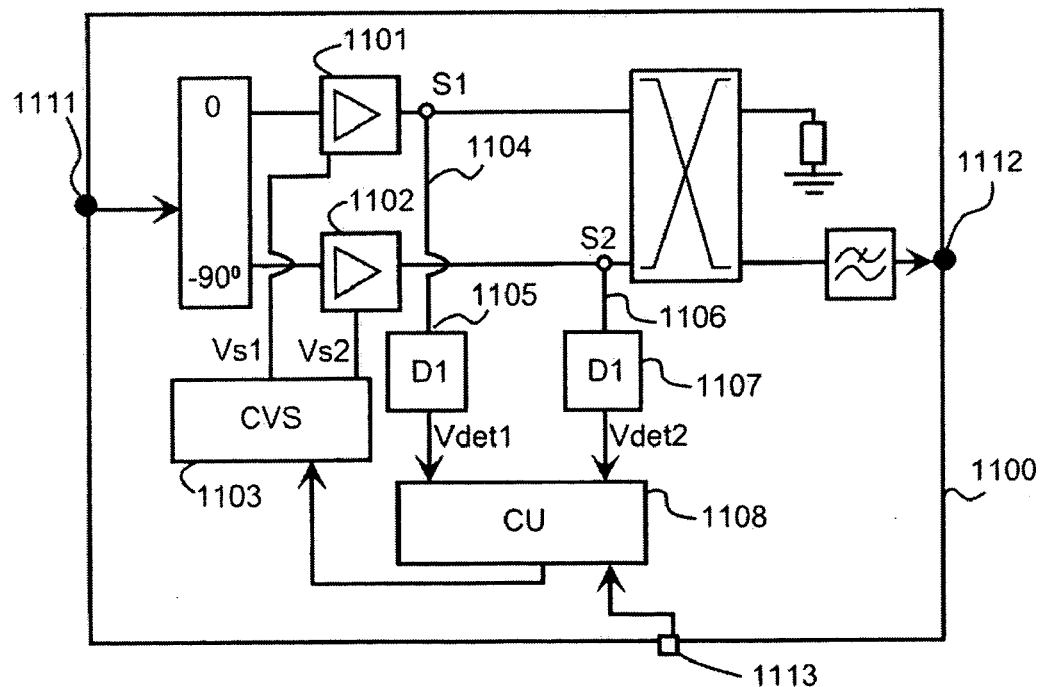
FIG. 11 shows an amplifier module according to an embodiment of the invention.

FIG. 11 shows an amplifier module 1100 according to an embodiment of the invention. The amplifier module comprises a signal input terminal 1111 and a signal output terminal 1112, amplifier stages 1011 and 1012, detectors 1105 and 1107, a control unit 1108, and a controllable supply unit 1103. The amplifier stages 1011 and 1012 are coupled between the signal input terminal and the signal output terminal to be an in-phase amplifier stage and a quadrature amplifier stage of a balanced power amplifier. The controllable supply 1103 is disposed to produce a supply voltage Vs1 for the in-phase amplifier stage and a supply voltage Vs2 for the quadrature amplifier stage. An in-phase signal S1 is conducted via a signal path 1104 to the detector 1105. The detector 1105 is disposed to detect a voltage value Vdet1 of the in-phase signal S1. A quadrature signal S2 is conducted via a signal path 1106 to the detector 1107.

The detector 1107 is disposed to detect a voltage value Vdet2 of the quadrature signal S2. The control unit 1108 is disposed determine a value of the supply voltage Vs1 for the in-phase amplifier stage at least partly according to the voltage value Vdet1 of the in-phase signal S1 and to determine a value of the supply voltage Vs2 for the quadrature amplifier stage at least partly according to the voltage value Vdet2 of the quadrature signal S2. The control unit 1108 can be accordant to any of the control units of the balanced power amplifiers described above and with the aid of FIGS. 3-9. The detected voltage value Vdet1 (Vdet2) can represent a maximum potential difference between the in-phase (quadrature) signal and a ground potential, a minimum potential difference between the in-phase (quadrature) signal and the ground potential, or an amplitude of an ac-component of the in-phase (quadrature) signal. The controllable supply unit 1103 can comprise means for producing individual supply voltages Vs1 and Vs2 as shown in FIG. 3 or means for producing a common supply voltage Vs1=Vs2=Vs as shown e.g. in FIG. 5. The amplifier module can further have a control interface 1113 via which external control signals can be delivered to the control unit 1108. The external control signals may comprise e.g. an indication of desired level of an output signal of the amplifier module.

Figure 12:
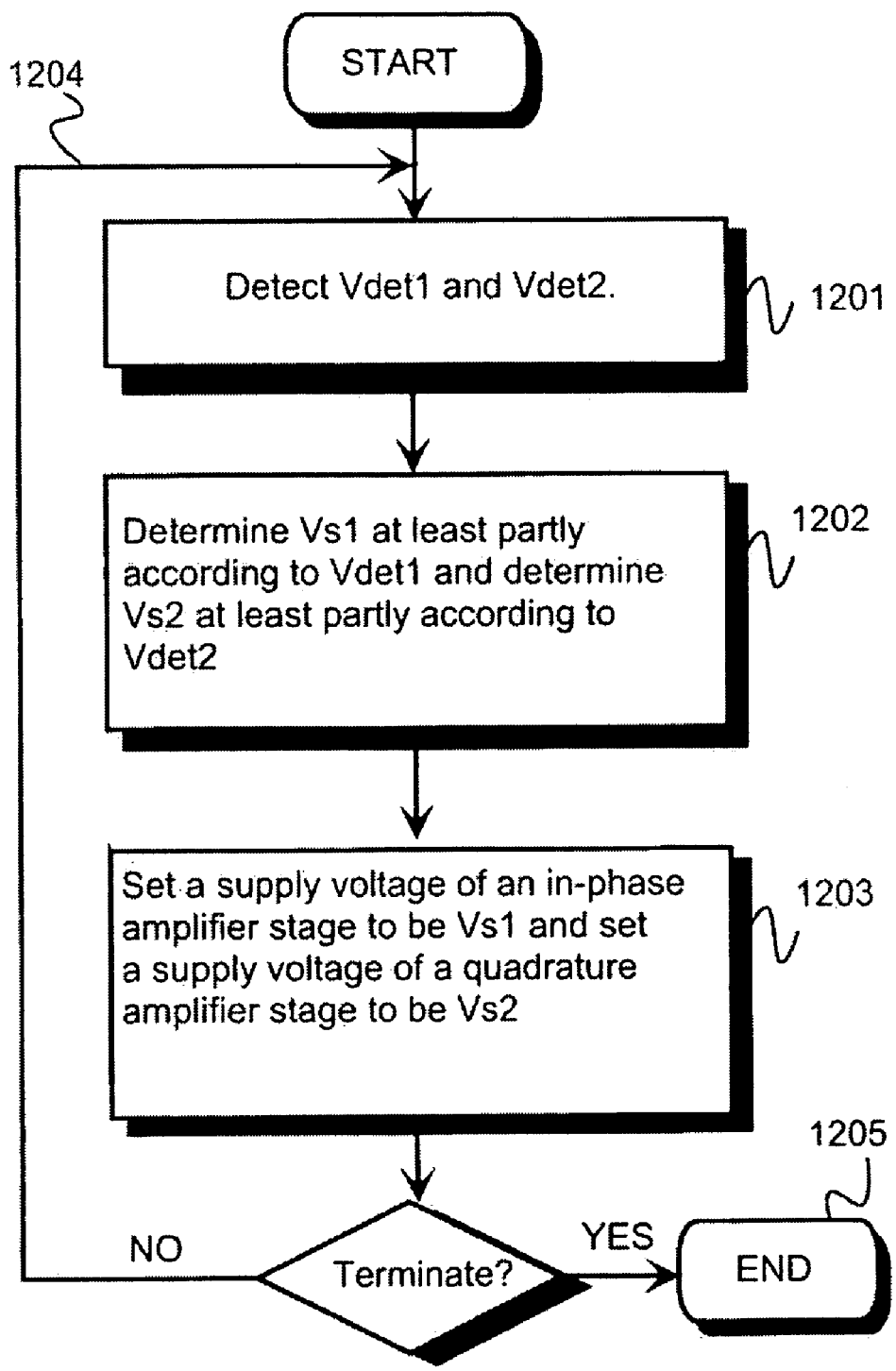
FIG. 12 shows a flow chart for a method according to an embodiment of the invention for optimizing efficiency of a balanced power amplifier having an in-phase amplifier stage and a quadrature amplifier stage.

FIG. 12 shows a flow chart for a method according to an embodiment of the invention for optimizing the efficiency of a balanced power amplifier having an in-phase amplifier stage and a quadrature amplifier stage. A phase 1201 comprises detecting a voltage value Vdet1 of an in-phase signal and detecting a voltage value Vdet2 of a quadrature signal. The detected voltage value of the in-phase (quadrature) signal can represent a maximum potential difference between the in-phase (quadrature) signal and a ground potential, a minimum potential difference between the in-phase (quadrature) signal and the ground potential, or an amplitude of an ac-component of the in-phase (quadrature) signal. A phase 1202 comprises determining a first supply voltage value Vs1 at least partly according to the detected voltage value Vdet1 of the in-phase signal and determining a second supply voltage value Vs2 at least partly according to the detected voltage value Vdet2 of the quadrature signal. A phase 1203 comprises setting a supply voltage of the in-phase amplifier stage to be the first supply voltage value Vs1 and setting a supply voltage of the quadrature amplifier stage to be the second supply voltage value Vs2. When a control of the supply voltages is realized with analogue components, as in FIG. 5, this process is performed in a time-continuous manner so that the phases 1201-1203 are overlapping. When the control of the supply voltages is realized with a component performing operations in a time discrete manner, as the DSP 911 in FIG. 9, this process can be repeated 1204 at a desired pace in order to follow changing levels of the in-phase and quadrature signals. The process can also be terminated 1205.

In a method according to an embodiment of the invention the detected voltage value of the in-phase signal is substantially the amplitude of the ac-component of the in-phase signal and the detected voltage value of the quadrature signal is substantially the amplitude of the ac-component of the quadrature signal.

In a method according to an embodiment of the invention both the first supply voltage value and the second supply voltage value are determined according to a maximum of the following: the detected amplitude of the ac-component of the in-phase signal and the detected amplitude of the ac-component of the quadrature signal.

In a method according to an embodiment of the invention both the first supply voltage value and the second supply voltage value are determined to be a predetermined margin plus said maximum.

It will be evident to any person skilled in the art that the invention and its embodiments are thus not limited to the above-described examples, but may vary within the scope of the independent claims.

What is claimed is:

1. A balanced power amplifier having an in-phase amplifier stage and a quadrature amplifier stage, comprising:
    a first detector disposed to detect a voltage value of an in-phase signal, the in-phase signal being an output signal of the in-phase amplifier stage,
    a second detector disposed to detect a voltage value of a quadrature signal, the quadrature signal being an output signal of the quadrature amplifier stage,
    a controllable supply unit disposed to produce supply voltages for energizing the in-phase amplifier stage and for energizing the quadrature amplifier stage, and
    a control unit disposed to determine a value of a supply voltage for energizing the in-phase amplifier stage at least partly according to said voltage value of the in-phase signal and to said voltage value of the quadrature signal, and to determine a value of a supply voltage for energizing the quadrature amplifier stage at least partly according to said voltage value of the quadrature signal and to said voltage value of the in-phase signal.

2. The balanced power amplifier according to claim 1, wherein said voltage value of the in-phase signal is substantially one of the following: an amplitude of an ac-component of the in-phase signal, a maximum potential difference between the in-phase signal and a ground potential, and a minimum potential difference between the in-phase signal and the ground potential, and said voltage value of the quadrature signal is substantially one of the following: an amplitude of an ac-component of the quadrature signal, a maximum potential difference between the quadrature signal and the ground potential, and a minimum potential difference between the quadrature signal and the ground potential.

3. The balanced power amplifier according to claim 1, wherein said voltage value of the in-phase signal is substantially an amplitude of an ac-component of the in-phase signal and said voltage value of the quadrature signal is substantially an amplitude of an ac-component of the quadrature signal.

4. The balanced power amplifier according to claim 3, wherein said control unit is disposed to determine the value of the supply voltage for energizing the in-phase amplifier stage to be substantially a first predetermined safety margin plus said amplitude of the ac-component of the in-phase signal and to determine the value of the supply voltage for energizing the quadrature amplifier stage to be substantially a second predetermined safety margin plus said amplitude of the ac-component of the quadrature signal.

5. The balanced power amplifier according to claim 4, wherein the controllable supply unit comprises a first switched mode power supply disposed to produce the supply voltage for energizing the in-phase amplifier stage and a second switched mode power supply disposed to produce the supply voltage for energizing the quadrature amplifier stage.

6. The balanced power amplifier according to claim 3, wherein said control unit is disposed to determine both the value of the supply voltage for energizing the in-phase amplifier stage and the value of the supply voltage for energizing the quadrature amplifier stage according to a maximum of the following: said amplitude of the ac-component of the in-phase signal and said amplitude of the ac-component of the quadrature signal.

7. The balanced power amplifier according to claim 6, wherein said control unit is disposed to determine both the value of the supply voltage for energizing the in-phase amplifier stage and the value of the supply voltage for energizing the quadrature amplifier stage to be substantially said maximum plus a predetermined safety margin.

8. The balanced power amplifier according to claim 6, wherein the controllable supply unit comprises a switched mode power supply disposed to produce both the supply voltage for energizing the in-phase amplifier stage and the supply voltage for energizing the quadrature amplifier stage.

9. The balanced power amplifier according to claim 1, wherein said control unit comprises an input for an external control signal and said control unit is disposed to determine the value of the supply voltage for energizing the in-phase amplifier stage partly according to said external control signal and to determine the value of the supply voltage for energizing the quadrature amplifier stage partly according to said external control signal.

10. The balanced power amplifier according to claim 1, wherein biasing of the in-phase amplifier stage is controlled at least partly according to said voltage value of the in-phase signal and biasing of the quadrature amplifier stage is controlled at least partly according to said voltage value of the quadrature signal.

11. The balanced power amplifier according to claim 1, wherein said control unit comprises a reference element disposed to produce a reference signal for at least partly cancelling an effect of temperature variations on the value of the supply voltage for energizing the in-phase amplifier stage and on the value of the supply voltage for energizing the quadrature amplifier stage.

12. The balanced power amplifier according to claim 1, wherein said first detector is a diode envelope detector and said second detector is a diode envelope detector.

13. A mobile communication device comprising:
a first amplifier stage disposed to be an in-phase amplifier stage of a balanced power amplifier and a second amplifier stage disposed to be a quadrature amplifier stage of said balanced power amplifier,
a first detector disposed to detect a voltage value of an in-phase signal, the in-phase signal being an output signal of the in-phase amplifier stage,
a second detector disposed to detect a voltage value of a quadrature signal, the quadrature signal being an output signal of the quadrature amplifier stage,
a controllable supply unit disposed to produce supply voltages for energizing the in-phase amplifier stage and for energizing the quadrature amplifier stage, and
a control unit disposed to determine a value of a supply voltage for energizing the in-phase amplifier stage at least partly according to said voltage value of the in-phase signal and to said voltage value of the quadrature signal, and to determine a value of a supply voltage for energizing the quadrature amplifier stage at least partly according to said voltage value of the quadrature signal and to said voltage value of the in-phase signal.

14. The mobile communication device according to claim 13, wherein said voltage value of the in-phase signal is substantially an amplitude of an ac-component of the in-phase signal and said voltage value of the quadrature signal is substantially an amplitude of an ac-component of the quadrature signal.

15. The mobile communication device according to claim 14, wherein said control unit is disposed to determine both the value of the supply voltage for energizing the in-phase amplifier stage and the value of the supply voltage for energizing the quadrature amplifier stage according to a maximum of the following: said amplitude of the ac-component of the in-phase signal and said amplitude of the ac-component of the quadrature signal.

16. The mobile communication device according to claim 15, wherein said control unit is disposed to determine both the value of the supply voltage for energizing the in-phase amplifier stage and the value of the supply voltage for energizing the quadrature amplifier stage to be substantially said maximum plus a predetermined safety margin.

17. The mobile communication device according to claim 13, wherein the mobile communication device comprises a controllable gain unit disposed to at least partly compensate a change in a gain of the balanced power amplifier, the change in the gain being caused by a change in an operating point of an output stage transistor of said balanced power amplifier.

18. The mobile communication device according to claim 13, wherein the mobile communication device is a mobile phone.

19. An amplifier module comprising:
a signal input terminal and a signal output terminal,
a first amplifier stage coupled between the signal input terminal and the signal output terminal and disposed to be an in-phase amplifier stage of a balanced power amplifier,
a second amplifier stage coupled between the signal input terminal and the signal output terminal and disposed to be a quadrature amplifier stage of said balanced power amplifier,
a first detector disposed to detect a voltage value of an in-phase signal, the in-phase signal being an output signal of the in-phase amplifier stage,
a second detector disposed to detect a voltage value of a quadrature signal, the quadrature signal being an output signal of the quadrature amplifier stage,
a controllable supply unit disposed to produce supply voltages for energizing the in-phase amplifier stage and for energizing the quadrature amplifier stage, and
a control unit disposed to determine a value of a supply voltage for energizing the in-phase amplifier stage at least partly according to said voltage value of the in-phase signal and to said voltage value of the quadrature signal, and to determine a value of a supply voltage for energizing the quadrature amplifier stage at least partly according to said voltage value of the quadrature signal and said voltage value of the in-phase signal.

20. The amplifier module according to claim 19, wherein said voltage value of the in-phase signal is substantially an amplitude of an ac-component of the in-phase signal and said voltage value of the quadrature signal is substantially an amplitude of an ac-component of the quadrature signal.

21. The amplifier module according to claim 20, wherein said control unit is disposed to determine both the value of the supply voltage for energizing the in-phase amplifier stage and the value of the supply voltage for energizing the quadrature amplifier stage according to a maximum of the following: said amplitude of the ac-component of the in-phase signal and said amplitude of the ac-component of the quadrature signal.

22. The amplifier module according to claim 21, wherein said control unit is disposed to determine both the value of the supply voltage for energizing the in-phase amplifier stage and the value of the supply voltage for energizing the quadrature amplifier stage to be substantially said maximum plus a predetermined safety margin.

23. An amplifier module according to claim 19, wherein said control unit comprises an input for an external control signal and said control unit is disposed to determine the value of the supply voltage for energizing the in-phase amplifier stage partly according to said external control signal and to determine the value of the supply voltage for energizing the quadrature amplifier stage partly according to said external control signal.

24. A method for optimizing efficiency of a balanced power amplifier having an in-phase amplifier stage and a quadrature amplifier stage, the method comprising:
detecting a voltage value of an in-phase signal, the in-phase signal being an output signal of the in-phase amplifier stage,
detecting a voltage value of a quadrature signal, the quadrature signal being an output signal of the quadrature amplifier stage, determining a first supply voltage value at least partly according to said voltage value of the in-phase signal and to said voltage value of the quadrature signal, determining a second supply voltage value at least partly according to said voltage value of the quadrature signal and to said voltage value of the in-phase signal, and setting a supply voltage of the in-phase amplifier stage to be the first supply voltage value and setting a supply voltage of the quadrature amplifier stage to be the second supply voltage value.

25. The method according to claim 21, wherein the detecting said voltage value of an in-phase signal is detecting an amplitude of an ac-component of the in-phase signal and the detecting said voltage value of a quadrature signal is detecting an amplitude of an ac-component of the quadrature signal.

26. The method according to claim 22, wherein both the first supply voltage value and the second supply voltage value are determined according to a maximum of the following: the amplitude of the ac-component of the in-phase signal and the amplitude of the ac-component of the quadrature signal.

27. The method according to claim 23, wherein both the first supply voltage value and the second supply voltage value are determined to be a predetermined margin plus said maximum.

28. A balanced power amplifier having an in-phase amplifier stage and a quadrature amplifier stage, comprising:
means for detecting a voltage value of an in-phase signal, the in-phase signal being an output signal of the in-phase amplifier stage,
means for detecting a voltage value of a quadrature signal, the quadrature signal being an output signal of the quadrature amplifier stage,
means for producing supply voltages for energizing the in-phase amplifier stage and for energizing the quadrature amplifier stage, and
means for determining a value of a supply voltage for energizing the in-phase amplifier stage at least partly according to said voltage value of the in-phase signal and to said voltage value of the quadrature signal, and for determining a value of a supply voltage for energizing the quadrature amplifier stage at least partly according to said voltage value of the quadrature signal and to said voltage value of the in-phase signal.

29. The balanced power amplifier according to claim 28, wherein said voltage value of the in-phase signal is substantially an amplitude of an ac-component of the in-phase signal and said voltage value of the quadrature signal is substantially an amplitude of an ac-component of the quadrature signal.

30. A mobile communication device comprising:
a first amplifier stage disposed to be an in-phase amplifier stage of a balanced power amplifier and a second amplifier stage disposed to be a quadrature amplifier stage of said balanced power amplifier,
means for detecting a voltage value of an in-phase signal, the in-phase signal being an output signal of the in-phase amplifier stage,
means for detecting a voltage value of a quadrature signal, the quadrature signal being an output signal of the quadrature amplifier stage,
means for producing supply voltages for energizing the in-phase amplifier stage and for energizing the quadrature amplifier stage, and
means for determining a value of a supply voltage for energizing the in-phase amplifier stage at least partly according to said voltage value of the in-phase signal and to said voltage value of the quadrature signal, and for determining a value of a supply voltage for energizing the quadrature amplifier stage at least partly according to said voltage value of the quadrature signal and to said voltage value of the in-phase signal.

31. The mobile communication device according to claim 30, wherein said voltage value of the in-phase signal is substantially an amplitude of an ac-component of the in-phase signal and said voltage value of the quadrature signal is substantially an amplitude of an ac-component of the quadrature signal.

32. An amplifier module comprising:
means for inputting a signal and means for outputting said signal,
a first amplifier stage coupled between the means for inputting and the means for outputting and disposed to be an in-phase amplifier stage of a balanced power amplifier,
a second amplifier stage coupled between the means for inputting and the means for outputting and disposed to be a quadrature amplifier stage of said balanced power amplifier,
means for detecting a voltage value of an in-phase signal, the in-phase signal being an output signal of the in-phase amplifier stage,
means for detecting a voltage value of a quadrature signal, the quadrature signal being an output signal of the quadrature amplifier stage,
means for producing supply voltages for energizing the in-phase amplifier stage and for energizing the quadrature amplifier stage, and
means for determining a value of a supply voltage for energizing the in-phase amplifier stage at least partly according to said voltage value of the in-phase signal and to said voltage value of the quadrature signal, and for determining a value of a supply voltage for energizing the quadrature amplifier stage at least partly according to said voltage value of the quadrature signal and said voltage value of the in-phase signal.

33. The amplifier module according to claim 32, wherein said voltage value of the in-phase signal is substantially an amplitude of an ac-component of the in-phase signal and said voltage value of the quadrature signal is substantially an amplitude of an ac-component of the quadrature signal.

* * * * *

UNITED STATES PATENT AND TRADEMARK OFFICE
CERTIFICATE OF CORRECTION

| | |
|---|---|
| PATENT NO. | : 7,330,070 B2 |
| APPLICATION NO. | : 11/272431 |
| DATED | : February 12, 2008 |
| INVENTOR(S) | : Väisänen |

It is certified that error appears in the above-identified patent and that said Letters Patent is hereby corrected as shown below:

Column 16, line 26, claim 4, line 2, please delete the word "detennine" and replace it with --determine--.

Signed and Sealed this

Twenty-fourth Day of June, 2008

JON W. DUDAS
*Director of the United States Patent and Trademark Office*